United States Patent
Cho et al.

(10) Patent No.: US 10,763,233 B2
(45) Date of Patent: *Sep. 1, 2020

(54) APPARATUS AND METHOD FOR REDUCING VOLUME OF RESOURCE ALLOCATION INFORMATION MESSAGE IN A BROADBAND WIRELESS COMMUNICATION SYSTEM

(71) Applicant: Samsung Electronics Co., Ltd., Gyeonggi-do (KR)

(72) Inventors: Hee-Kwun Cho, Incheon (KR); In-Seok Hwang, Seoul (KR); June Moon, Seoul (KR); Chung-Ryul Chang, Gyeonggi-do (KR); Jae-Ho Jeon, Gyeonggi-do (KR); Soon-Young Yoon, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/282,882

(22) Filed: Feb. 22, 2019

(65) Prior Publication Data

US 2019/0206826 A1    Jul. 4, 2019

Related U.S. Application Data

(63) Continuation of application No. 14/803,935, filed on Jul. 20, 2015, which is a continuation of application
(Continued)

(30) Foreign Application Priority Data

Jul. 7, 2006    (KR) .................. 10-2006-0064126
Jul. 14, 2006   (KR) .................. 10-2006-0066545

(51) Int. Cl.
*H04W 72/04* (2009.01)
*H01L 23/00* (2006.01)
(Continued)

(52) U.S. Cl.
CPC .............. *H01L 24/43* (2013.01); *H01L 24/03* (2013.01); *H01L 24/05* (2013.01); *H04L 5/0007* (2013.01);
(Continued)

(58) Field of Classification Search
CPC ......... H01L 24/43; H01L 24/05; H01L 24/03; H01L 2224/05395; H01L 2224/48463;
(Continued)

(56) References Cited

U.S. PATENT DOCUMENTS

2004/0252661 A1    12/2004   Lintulampi et al.
2005/0030931 A1     2/2005   Sung et al.
(Continued)

FOREIGN PATENT DOCUMENTS

EP       1 534 035        5/2005
KR    10-2005-0048256     5/2005
(Continued)

OTHER PUBLICATIONS

Kwon et al., "Design and Implementation of a Simulator Based on a Cross-Layer Protocol between MAC and PHY Layers in a WiBro Compatible IEEE 802.16e OFDMA System", IEEE Communications Magazine, Dec. 2005.
(Continued)

*Primary Examiner* — Marcus Hammonds
(74) *Attorney, Agent, or Firm* — The Farrell Law Firm, P.C.

(57) ABSTRACT

An apparatus and method for reducing the volume of a resource allocation information message in a broadband wireless communication system are provided. The method includes transmitting a message including information indicating a periodicity of an uplink control channel for an initial network entry; and receiving an uplink signal for the initial network entry through the uplink control channel.

20 Claims, 8 Drawing Sheets

Related U.S. Application Data

No. 11/774,923, filed on Jul. 9, 2007, now Pat. No. 9,088,980.

(51) Int. Cl.
  *H04L 5/00* (2006.01)
  *H04W 72/08* (2009.01)
  *H04W 48/10* (2009.01)

(52) U.S. Cl.
  CPC ..... *H04W 72/042* (2013.01); *H04W 72/0413* (2013.01); *H01L 24/48* (2013.01); *H01L 2224/02166* (2013.01); *H01L 2224/04042* (2013.01); *H01L 2224/05* (2013.01); *H01L 2224/052* (2013.01); *H01L 2224/05198* (2013.01); *H01L 2224/05395* (2013.01); *H01L 2224/43* (2013.01); *H01L 2224/48463* (2013.01); *H01L 2924/00014* (2013.01); *H01L 2924/01033* (2013.01); *H01L 2924/181* (2013.01); *H04W 48/10* (2013.01); *H04W 72/0406* (2013.01); *H04W 72/08* (2013.01)

(58) Field of Classification Search
  CPC ....... H01L 2224/05; H01L 2924/01033; H01L 2224/04042; H01L 2224/05198; H01L 24/48; H01L 2924/00014; H01L 2924/181; H01L 2224/43; H01L 2224/02166; H01L 2224/052
  See application file for complete search history.

(56) References Cited

U.S. PATENT DOCUMENTS

| | | |
|---|---|---|
| 2005/0058058 A1 | 3/2005 | Cho et al. |
| 2005/0107036 A1* | 5/2005 | Song .................... H04L 1/0009 455/23 |
| 2005/0192011 A1* | 9/2005 | Hong ................ H04W 36/0077 455/440 |
| 2005/0232181 A1 | 10/2005 | Park et al. |
| 2006/0029011 A1 | 2/2006 | Etemad et al. |
| 2006/0039328 A1* | 2/2006 | Ihm ........................ H04B 7/063 370/334 |
| 2006/0111129 A1 | 5/2006 | Ihm et al. |
| 2006/0194598 A1* | 8/2006 | Kim ...................... H04W 48/16 455/509 |
| 2006/0203712 A1 | 9/2006 | Lim et al. |
| 2006/0203766 A1* | 9/2006 | Kim .................. H04W 52/0216 370/328 |
| 2007/0189205 A1* | 8/2007 | Terry .................... H04L 1/1812 370/328 |
| 2007/0286066 A1* | 12/2007 | Zhang .................. H04L 5/0092 370/208 |
| 2008/0069031 A1* | 3/2008 | Zhang ................. H04B 7/0617 370/328 |
| 2008/0298315 A1* | 12/2008 | Ihm ........................ H04W 8/30 370/329 |
| 2009/0046637 A1* | 2/2009 | Kim .................... H04W 72/005 370/329 |
| 2009/0080351 A1* | 3/2009 | Ryu ...................... H04L 1/0003 370/312 |
| 2009/0175376 A1* | 7/2009 | Ihm ........................ H04B 7/063 375/267 |

FOREIGN PATENT DOCUMENTS

| | | |
|---|---|---|
| RU | 2 160 507 | 10/2000 |
| WO | WO 97/36433 | 10/1997 |
| WO | WO 2005/022772 | 3/2005 |
| WO | WO 2006/071096 | 7/2006 |

OTHER PUBLICATIONS

Kiseon Ryu et al., "Ranging Region Allocation using UCD Message", IEEE 802.16 Broadband Wireless Access Working Group, May 4, 2005.

Joanne Wilson et al., "Corrections for Reduced Compressed Private Maps", IEEE 802.16 Broadband Wireless Access Working Group, Mar. 9, 2005.

InSeok Hwang et al., "UL Control Region Clarification Finals". IEEE 802.16 Broadband Wireless Access Working Group, Sep. 21, 2006.

Dong-Hoon Cho et al., "Performance Analysis of the IEEE 802.16 Wireless Metropolitan Area Network", Proceedings of the First International Conference on Distributed Frameworks for Multimedia Applications (DFMA'05), Feb. 6, 2005.

Yeongmoon Son et al., "An Omission of UL-Map IE for Allocated Ranging Region", IEEE 802.16 Broadband Wireless Access Working Group, Mar. 9, 2005.

T. Kwon et al., "Design and Implementation of a Simulator Based on a Cross-Layer Protocol Between MAC and PHY Layers in a WiBro Compatible IEEE 802.16e OFDMA system," IEEE Commun. Mag., vol. 43, No. 12, pp. 136-146, Dec. 2005.

International Search Report dated Sep. 21, 2007 issued in counterpart application No. PCT/KR2007/003305.

Korean Office Action dated Jan. 29, 2010 issued in counterpart application No. 10-2006-0066545.

Malaysian Examination Report dated Nov. 30, 2016 issued in counterpart application No. PI2013000096, 2 pages.

U.S. Office Action dated Apr. 5, 2019 issued in counterpart U.S. Appl. No. 14/803,935, 6 pages.

Brazilian Pre-Examination Report dated Jun. 4, 2019 issued in counterpart application No. PI0713858-0, 7 pages.

European Search Report dated Jul. 11, 2019 issued in counterpart application No. 19178208.5-1215, 7 pages.

U.S. Office Action dated Sep. 19, 2019 issued in counterpart U.S. Appl. No. 14/803,935, 11 pages.

\* cited by examiner

APPARATUS AND METHOD FOR REDUCING VOLUME OF RESOURCE ALLOCATION INFORMATION MESSAGE IN A BROADBAND WIRELESS COMMUNICATION SYSTEM

PRIORITY

This application is a continuation of U.S. application Ser. No. 14/803,935, which was filed in the U.S. Patent and Trademark Office on Jul. 20, 2015, and is a continuation of U.S. application Ser. No. 11/774,923, filed in the U.S. Patent and Trademark Office on Jul. 9, 2007, issued as U.S. Pat. No. 9,088,980 on Jul. 21, 2015, and claims priority under 35 U.S.C. § 119(a) to Korean Application Serial Nos. 10-2006-0064126 and 10-2006-0066545, which were filed in the Korean Intellectual Property Office on Jul. 7, 2006 and Jul. 14, 2006, respectively, the entire content of each of which is incorporated herein by reference.

BACKGROUND OF THE INVENTION

1. Field of the Invention

The present invention relates generally to a broadband wireless communication system, and in particular, to an apparatus and method for reducing the volume of a resource allocation information message in a broadband wireless communication system.

2. Description of the Related Art

A future-generation communication system called a 4th Generation (4G) system is under an active study to provide services with different Quality of Service (QoS) requirements to users at or above 100 Mbps. An especially active research area concerns provisioning of high-speed services with mobility and QoS ensured to a Broadband Wireless Access (B WA) communication system such as a Wireless Local Area Network (WLAN) and a Wireless Metropolitan Area Network (WMAN). Such a major communication system is an Institute of Electrical and Electronics (IEEE) 802.16e system.

Main standards developed by the IEEE 802.16 working groups are IEEE 802.16d and IEEE 802.16e that are categorized into single carrier, Orthogonal Frequency Division Multiplexing (OFDM), and Orthogonal Frequency Division Multiple Access (OFDMA). The IEEE 802.16d/e OFDMA standard defines DownLink (DL) and UpLink (UL) frame structures with time and frequency resources and radio channel status-based resource allocation in the frames in order to effectively transmit digital bit information to a receiver.

FIG. 1 illustrates a frame structure in a conventional OFDMA communication system.

Referring to FIG. 1, an OFDMA frame includes a DL frame 110 and a UL frame 120.

The DL frame 110 is composed of a preamble 111, a Frame Control Header (FCH) 113, a DL-MAP 115, a UL-MAP 117, and DL data bursts 119.

The preamble 111 provides information by which a Mobile Station (MS) acquires an initial synchronization and performs a cell search. The FCH 113 indicates a coding scheme for the DL-MAP 115 and the UL-MAP 117. The DL-MAP 115 provides a resource allocation information message for each MS and the UL-MAP 117 provides a resource allocation information message for control regions 121 of the UL frame 120 and UL data bursts 123 to be transmitted from MSs. The DL data bursts 119 carry user data from a Base Station (BS) to MSs.

The UL frame 120 is composed of the control regions 121 and the UL data bursts 123. The control regions 121 deliver control information required for communications from the MSs to the BS and the UL data bursts 123 carry user data from the MSs to the BS.

The control regions 121 include a ranging channel 151, a Channel Quality Information (CQI) channel 153, an ACKnowledge (ACK) channel 155, and a sounding channel 157.

An MS can transmit data to the BS without resource allocation from the BS on the ranging channel 151. The ranging channel 151 is used for an initial network entry, a handoff requests, or a resource allocation request. The CQI channel 153 notifies the BS of the DL channel status of the MS. The ACK channel 155 indicates to the BS whether the MS has received a DL data burst successfully. The sounding channel 157 is a region from which the BS acquires channel information about the MS.

In the above-described OFDMA frame structure, the MAP information and the data bursts compete for resources because the MAP regions with the resource allocation information messages and the user data bursts are configured in the same frame. The MAP information and the user bursts are in a trade-off relationship in terms of resources. This means that as the amount of the MAP information increases, the amount of resources are available to the user bursts decreases. Although the frame structure is dynamically variable, the case is rare in real system implementation. Particularly, the control regions 121 of the UL frame 120 tend to have the same configuration in every frame. Transmission of the same resource allocation information message in every frame leads to the decrease of resources available to data bursts, thereby decreasing the overall data rate of the system.

SUMMARY OF THE INVENTION

The present invention is made to substantially solve at least the above problems and/or disadvantages and to provide at least the advantages below.

Accordingly, an aspect of the present invention is to provide an apparatus and method for reducing the overhead of a resource allocation information message in a broadband wireless communication system.

Another aspect of the present invention is to provide an apparatus and method for increasing the data rate of user data through periodic transmission of a resource allocation information message associated with a predetermined area in a broadband wireless communication system.

In accordance with an aspect of the present invention, a method is provided for operating a base station in a wireless communication system. The method includes transmitting a message including information indicating a periodicity of an uplink control channel for an initial network entry; and receiving an uplink signal for the initial network entry through the uplink control channel.

In accordance with another aspect of the present invention, a method is provided for operating a mobile station (MS) in a wireless communication system. The method includes receiving a message including information indicating a periodicity of an uplink control channel for an initial network entry; and transmitting an uplink signal for the initial network entry through the uplink control channel.

In accordance with another aspect of the present invention, an apparatus is provided for a base station in a wireless communication system. The apparatus includes a transmitter configured to transmit a message including information indicating a periodicity of an uplink control channel for an initial network entry; and a receiver configured to receive an uplink signal for the initial network entry through the uplink control channel.

In accordance with another aspect of the present invention, an apparatus is provided for operating a mobile station (MS) in a wireless communication system. The apparatus includes a receiver configured to receive a message including information indicating a periodicity of an uplink control channel for an initial network entry; and a transmitter configured to transmit an uplink signal for the initial network entry through the uplink control channel.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF EMBODIMENTS OF THE INVENTION

Various embodiments of the present invention will be described herein below with reference to the accompanying drawings. In the following description, well-known functions or constructions are not described in detail since they would obscure the invention in unnecessary detail.

The present invention discloses an apparatus and method for increasing the data rate of a system by reducing the overhead of a resource allocation information message in a broadband wireless communication system. The following description will be made in the context of an OFDMA system, by way of example.

Figure 1:
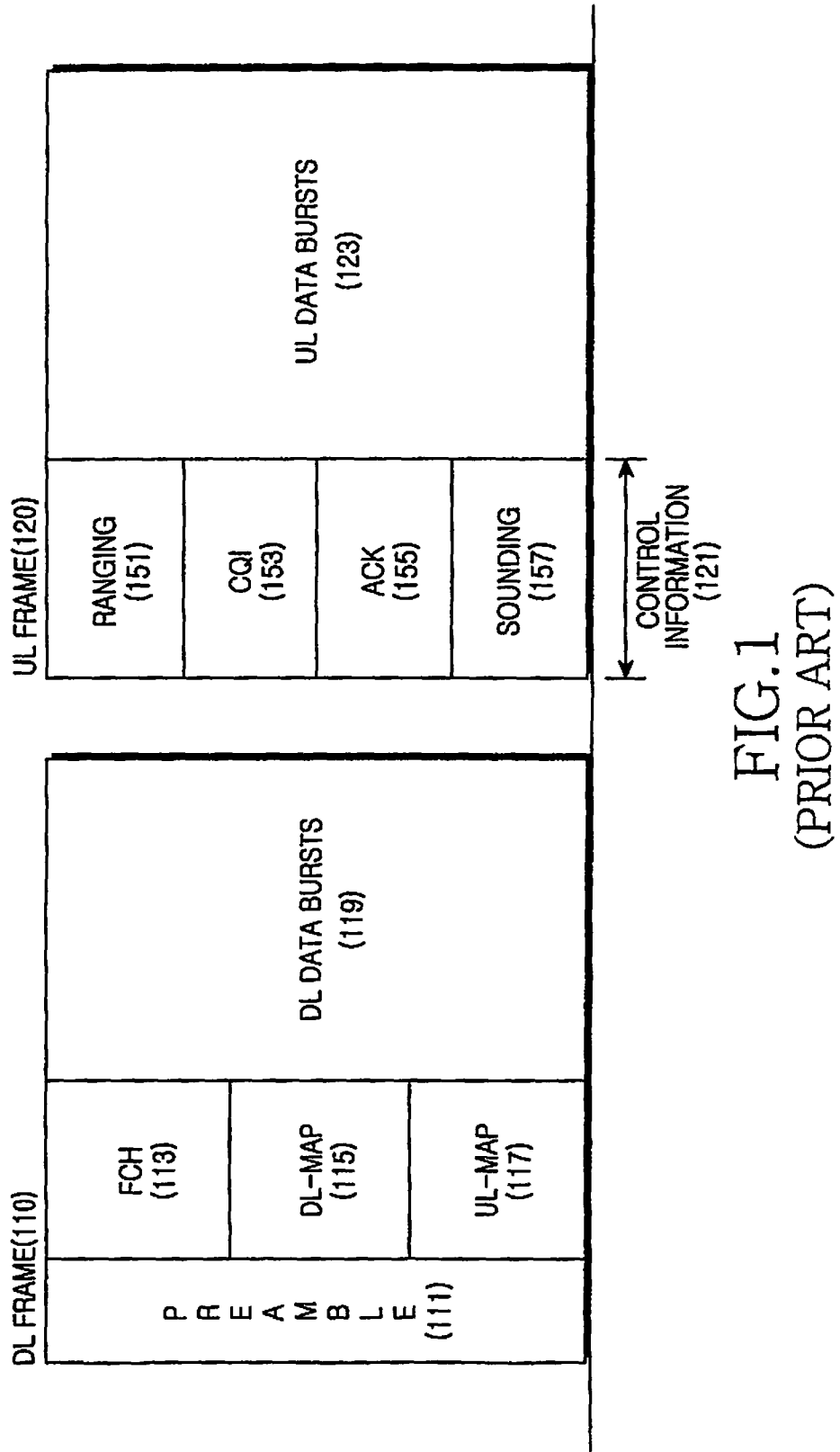
FIG. 1 illustrates a frame structure in a conventional OFDMA communication system.
Figure 2:
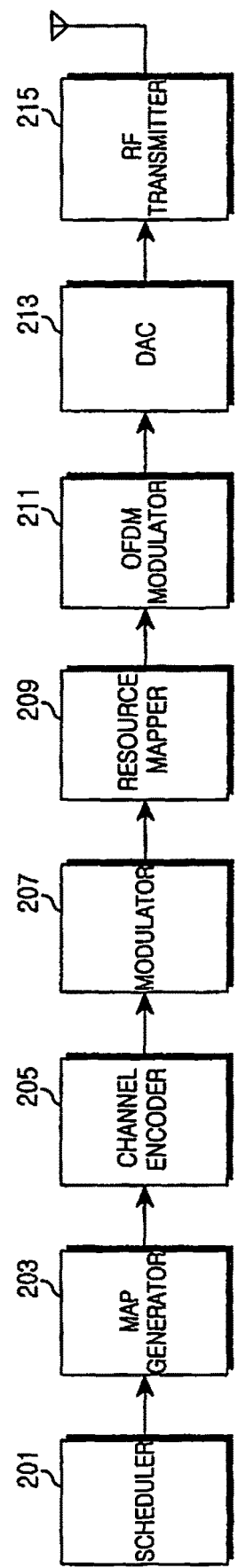
FIG. 2 is a block diagram of a transmitter in a broadband wireless communication system according to the present invention.

FIG. 2 is a block diagram of a transmitter of a BS in an OFDMA communication system according to the present invention.

Referring to FIG. 2, the transmitter includes a scheduler 201, a MAP generator 203, a channel encoder 205, a modulator 207, a resource mapper 209, an OFDM modulator 211, a Digital-to-Analog Converter (DAC) 213, and a Radio Frequency (RF) transmitter 215.

The scheduler 201 generates scheduling information for a resource allocation to a DL data burst region, a UL data burst region, and UL information regions (hereinafter, "resource allocation scheduling information"). The UL control regions include a ranging channel, a CQI channel, an ACK channel, and a sounding channel. The CQI channel is equivalent to a fast feedback channel. Particularly, the scheduler 201 determines whether to generate information about the resource allocation to the UL control regions (hereinafter, "UL control region allocation information") in accordance with the present invention. The UL control region allocation information can be about the entire UL control regions or part of the UL control regions. When it is time to generate the UL control region allocation information or when the UL control region allocation information is changed, the scheduler 201 controls the UL control region allocation information to be generated. Especially in the latter case, the scheduler 201 controls the UL control region allocation information to be generated in a predetermined number of successive frames.

The MAP generator 203 generates a MAP message, i.e. a resource allocation information message based on the resource allocation scheduling information received from the scheduler 201. Particularly the MAP generator 203 generates a MAP message according to whether the UL control region allocation information has been generated in the scheduler 201, i.e., if the UL control region allocation information is generated, the MAP generator 203 generates a MAP message including the UL control region allocation information. In this case, the MAP generator 203 includes valid duration information associated with the UL control region allocation information in the MAP message. On the other hand, if the UL control region allocation information is not generated, the MAP generator 203 generates a MAP message without the UL control region allocation information.

The channel encoder 205 encodes the resource allocation information message received from the MAP generator 203 at a predetermined coding rate. The modulator 207 modulates the coded data received from the channel encoder 205 to symbols in a predetermined modulation scheme (e.g. Quadrature Phase Shift Keying (QPSK)).

The resource mapper 209 maps the symbols according to a frame structure, i.e., to subcarriers of a frame. The OFDM modulator 211 converts the mapped symbols, i.e. from a frequency signal to a time signal by an Inverse Fast Fourier Transform (IFFT).

The DAC 213 converts the time signal to an analog signal and the RF transmitter 215 upconverts the analog signal to a carrier frequency and transmits the carrier-frequency signal through an antenna.

Figure 3:
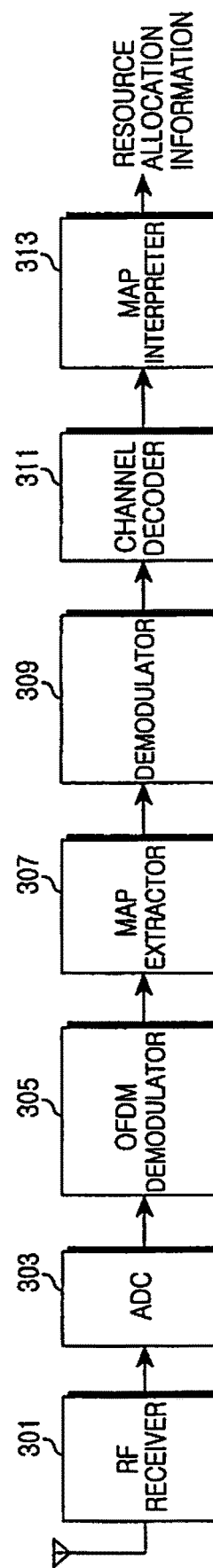
FIG. 3 is a block diagram of a receiver in the broadband wireless communication system according to the present invention.

FIG. 3 is a block diagram of a receiver of an MS in the OFDMA communication system according to the present invention.

Referring to FIG. 3, the receiver includes an RF receiver 301, an Analog-to-Digital Converter (ADC) 303, an OFDM demodulator 305, a MAP extractor 307, a demodulator 309, a channel decoder 311, and a MAP interpreter 313.

The RF receiver 301 downconverts an RF signal received through an antenna to a baseband signal and the ADC 303 converts the baseband signal to a digital signal.

The OFDM demodulator 305 converts the time signal received from the ADC 303 to a frequency signal by a Fast Fourier Transform (FFT). The MAP extractor 307 extracts a MAP signal from the frequency signal.

The demodulator 309 demodulates the MAP signal in a predetermined demodulation scheme and the channel decoder 311 decodes the demodulated MAP data at a predetermined coding rate.

The MAP interpreter 313 interprets the MAP information received from the channel decoder 311 and updates information about resources available to the MS. Especially the MAP interpreter 313 determines whether the MAP information includes UL control region allocation information and updates stored UL control region allocation information correspondingly in accordance with the present invention. In the presence of the UL control region allocation information in the MAP information, the MAP interpreter 313 updates the stored UL control region allocation information to the new UL control region allocation information. In the absence of the UL control region allocation information in the MAP information, the MAP interpreter 313 keeps the stored UL control region allocation information. In the case where the MAP message includes valid duration information, if the new UL control region allocation information has not been received until expiration of a valid duration indicated by the valid duration information, the MAP interpreter 313 deletes the stored UL control region allocation information. Herein, UL control regions include a ranging channel, a CQI channel, an ACK channel, and a sounding channel. The CQI channel is equivalent to a fast feedback channel.

While not shown, a control signal transmitter carries out UL signaling (e.g. ranging, CQI, ACK, etc.) to the BS based on the UL control region allocation information.

Figure 4:
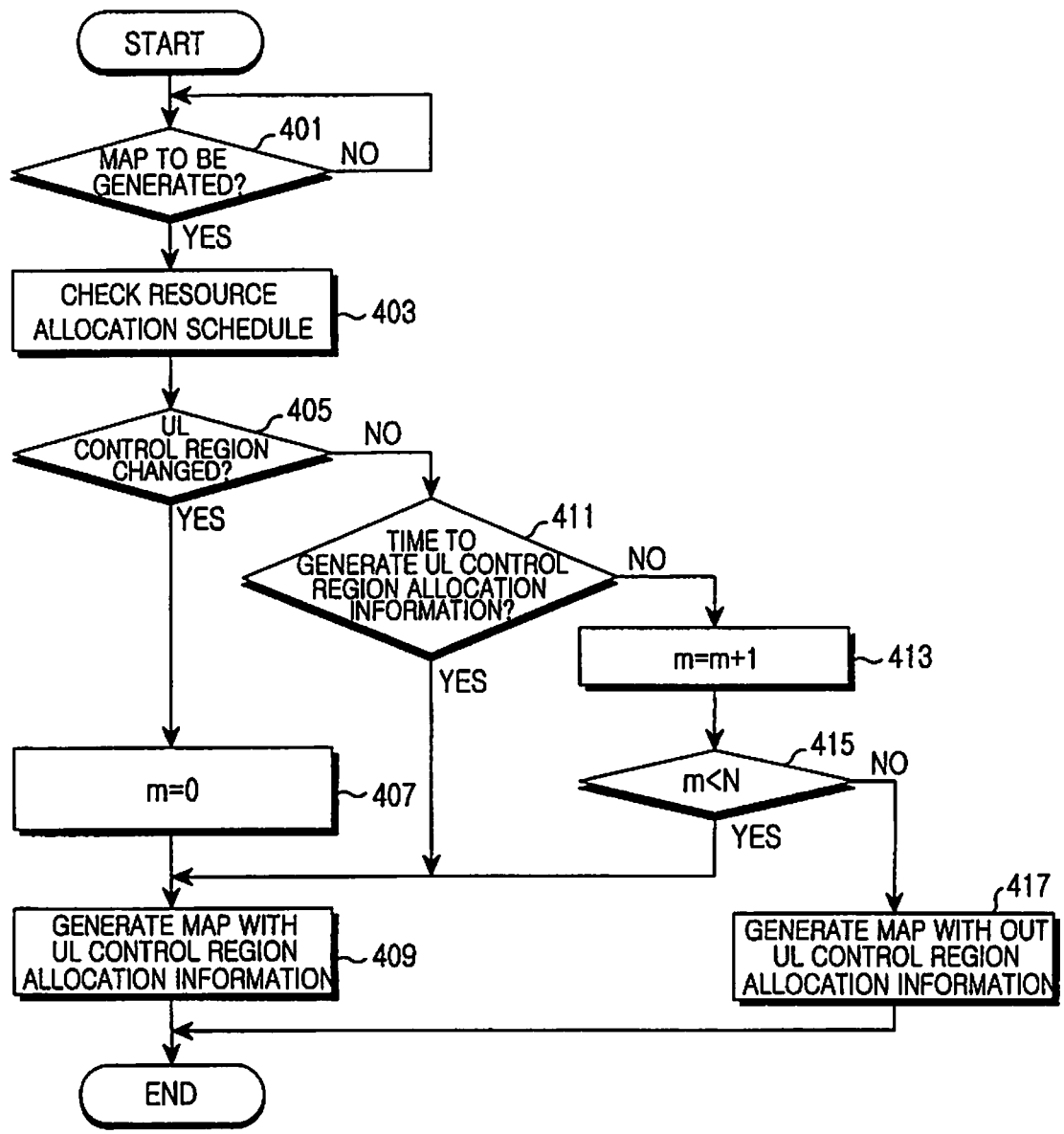
FIG. 4 is a flowchart illustrating an operation in a BS for generating a resource allocation information message in the broadband wireless communication system according to an exemplary embodiment of the present invention.

FIG. 4 is a flowchart illustrating an operation in the BS for generating a resource allocation information message in the OFDMA communication system according to an exemplary embodiment of the present invention.

Referring to FIG. 4, the MAP generator 203 determines whether it is time to generate a MAP message in step 401. If it is time to generate a MAP message, the MAP generator 203 checks a DL and UL resource allocation schedule in step 403.

In step 405, the MAP generator 203 determines whether UL control region allocation information has been changed by comparing UL control region allocation information set in the resource allocation schedule with the most recently transmitted UL control region allocation information. As stated before, UL control regions include a ranging channel, a CQI channel, an ACK channel, and a sounding channel, and the CQI channel is equivalent to a fast feedback channel.

If the UL control region allocation information has been changed, the MAP generator 203 sets a variable 'm' to 0 in step 407. The variable m indicates the number of frames without control region allocation information transmitted after the change of the UL control region allocation information.

In step 409, the MAP generator 203 generates a MAP message with the changed UL control region allocation information. The UL control region allocation information may be about all or part of the UL control regions.

On the other hand, if the UL control region allocation information has not been changed, the MAP generator 203 determines whether it is time to generate UL control region allocation information in step 411. Specifically, the MAP generator 203 counts the number of successive MAP transmissions without UL control region allocation information after a MAP transmission with UL control region allocation information and compares the count with a predetermined period for generating the UL control region allocation information. The period is a variable that depends on a system setting.

If it is time to generate UL control region allocation information in step 411, the MAP generator 203 generates a MAP message with the UL control region allocation information checked in step 403 in step 409.

If it is not time to generate UL control region allocation information in step 411, the MAP generator 203 increases the variable m by 1 in step 413. If it is not time to generate UL control region allocation information after the increase of m, the MAP generator 203 compares m with a variable 'N' in step 415. N indicates the number of successive frames with UL control region allocation information to ensure reception of the changed UL control region allocation information, i.e., the changed UL control region allocation information is transmitted in N successive frames counted from the time when the UL control region allocation information has been changed. N depends on a system setting.

If m is less than N, the MAP generator 203 generates the MAP message with the UL control region allocation information in step 409.

If m is greater than or equal to N, the MAP generator 203 generates a MAP message without the UL control region allocation information in step 417.

Figure 5:
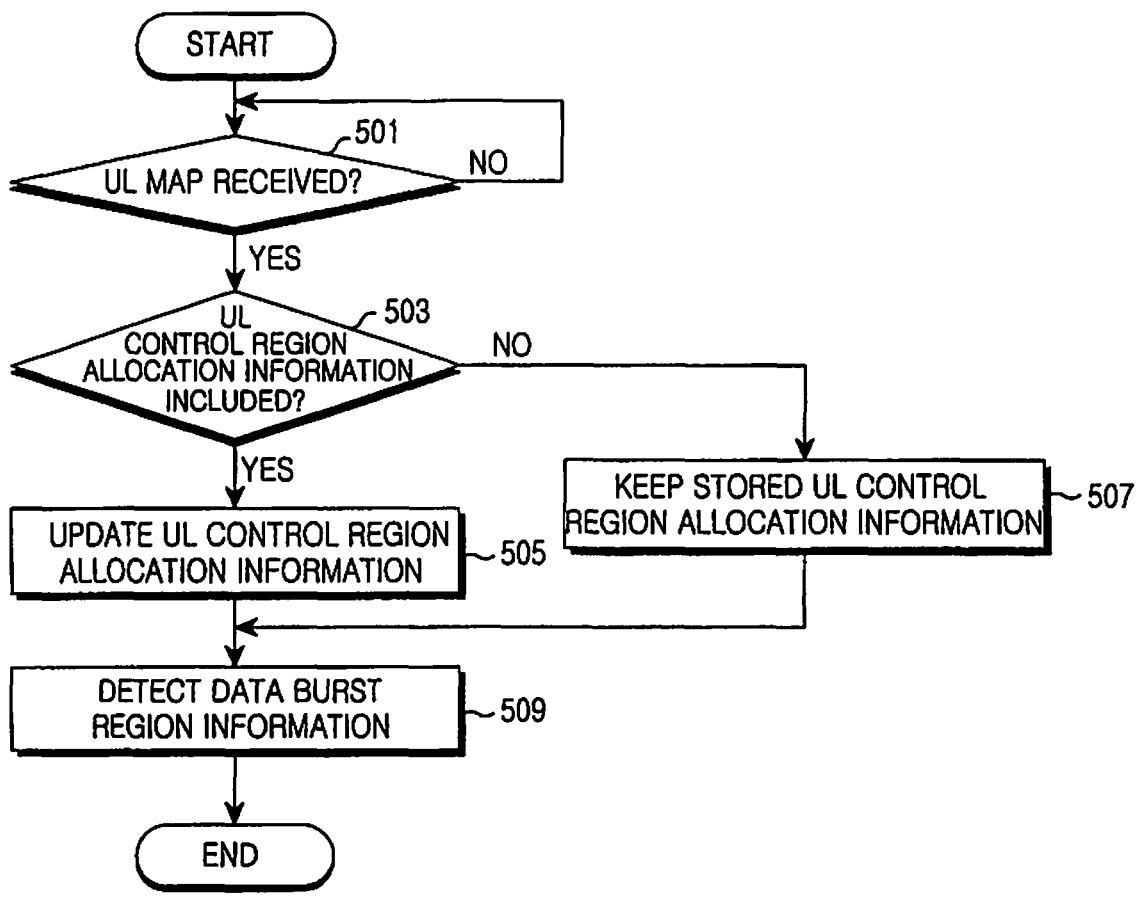
FIG. 5 is a flowchart illustrating an operation in an MS for detecting a resource allocation information message in the broadband wireless communication system according to an exemplary embodiment of the present invention.

FIG. 5 is a flowchart illustrating an operation in the MS for detecting a resource allocation information message in the OFDMA communication system according to an exemplary embodiment of the present invention.

Referring to FIG. 5, the MAP interpreter 313 monitors a reception of a MAP message in step 501.

Upon receipt of the MAP message, the MAP interpreter 313 determines whether the MAP message includes UL control region allocation information in step 503. UL control regions include a ranging channel, a CQI channel, an ACK channel, and a sounding channel, and the CQI channel is equivalent to a fast feedback channel.

In the presence of the UL control region allocation information, the MAP interpreter 313 updates stored UL control region allocation information to the received UL control region allocation information in step 505.

In the absence of the UL control region allocation information, the MAP interpreter 313 keeps the stored UL control region allocation information in step 507.

The MAP interpreter 313 checks data burst region information in step 509 and then ends the algorithm of the present invention.

Figure 6:
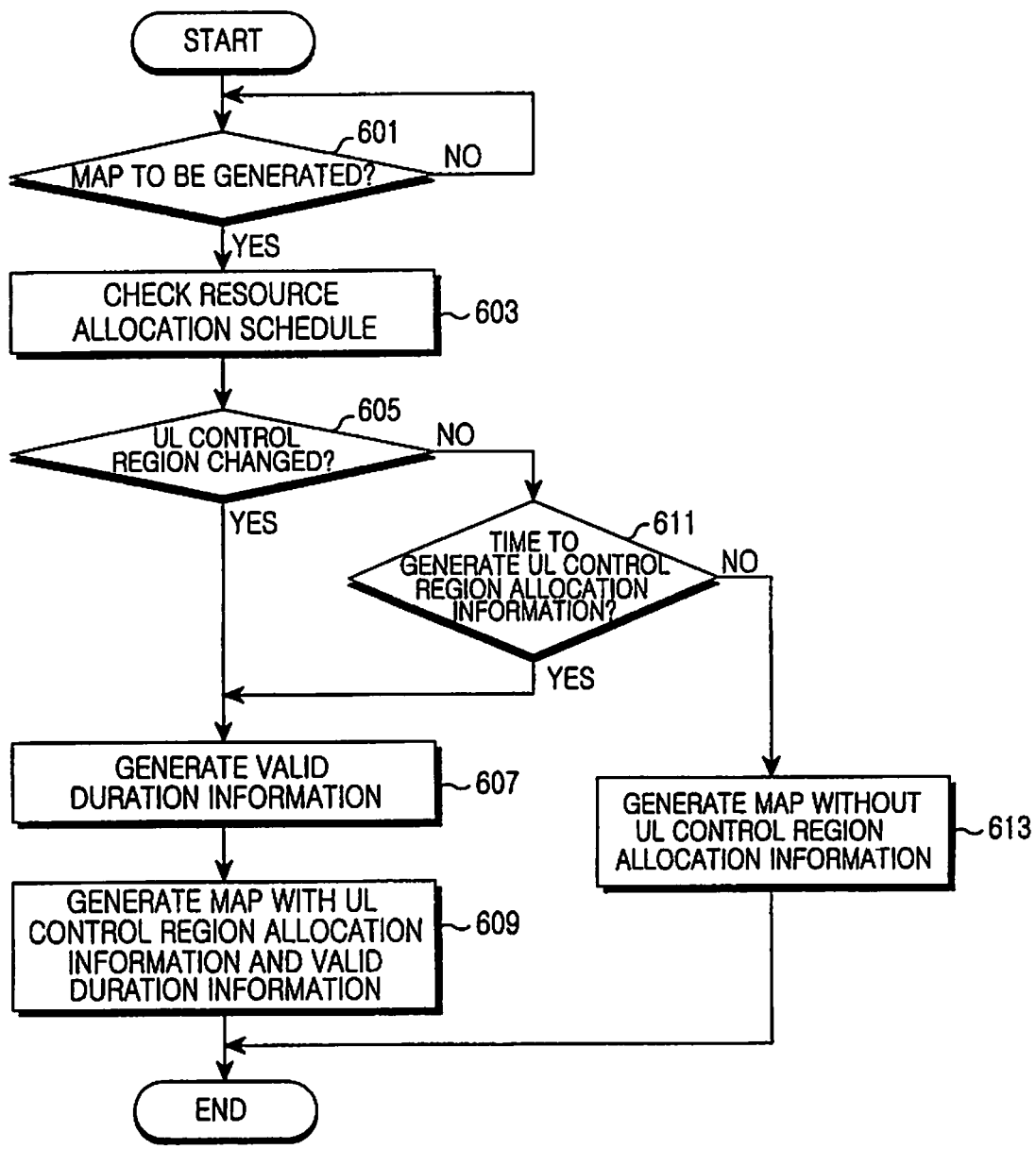
FIG. 6 is a flowchart illustrating an operation in the BS for generating a resource allocation information message in the broadband wireless communication system according to another exemplary embodiment of the present invention.

FIG. 6 is a flowchart illustrating an operation in the BS for generating a resource allocation information message in the OFDMA communication system according to another exemplary embodiment of the present invention.

Referring to FIG. 6, the MAP generator 203 determines whether it is time to generate a MAP message in step 601. If it is, the MAP generator 203 checks a DL and UL resource allocation schedule in step 603.

In step 605, the MAP generator 203 determines whether UL control region allocation information has been changed, by comparing UL control region allocation information set in the resource allocation schedule with the latest transmitted UL control region allocation information. As stated before, UL control regions include a ranging channel, a CQI channel, an ACK channel, and a sounding channel, and the CQI channel is equivalent to a fast feedback channel.

If the UL control region allocation information has been changed, the MAP generator 203 generates valid duration information for the UL control region allocation information in step 607. Because transmitted UL control region allocation information is not valid after a duration of a period has elapsed, in the case of periodic transmission of UL control region allocation information, the MAP generator 203 generates valid duration information to notify an MS of the period.

In step 609, the MAP generator 203 generates a MAP message with the changed UL control region allocation information and the valid duration information. The UL control region allocation information may contain information about some or all of the UL control regions.

On the other hand, if the UL control region allocation information has not been changed in step 605, the MAP generator 203 determines whether it is time to generate UL control region allocation information in step 611. Specifically, the MAP generator 203 counts the number of successive MAP transmissions without UL control region allocation information after a MAP transmission with UL control region allocation information, and compares the count with the period. The period is a variable depending on a system setting.

If it is not time to generate UL control region allocation information in step 611, the MAP generator 203 generates a MAP message without the UL control region allocation information in step 613.

Figure 7:
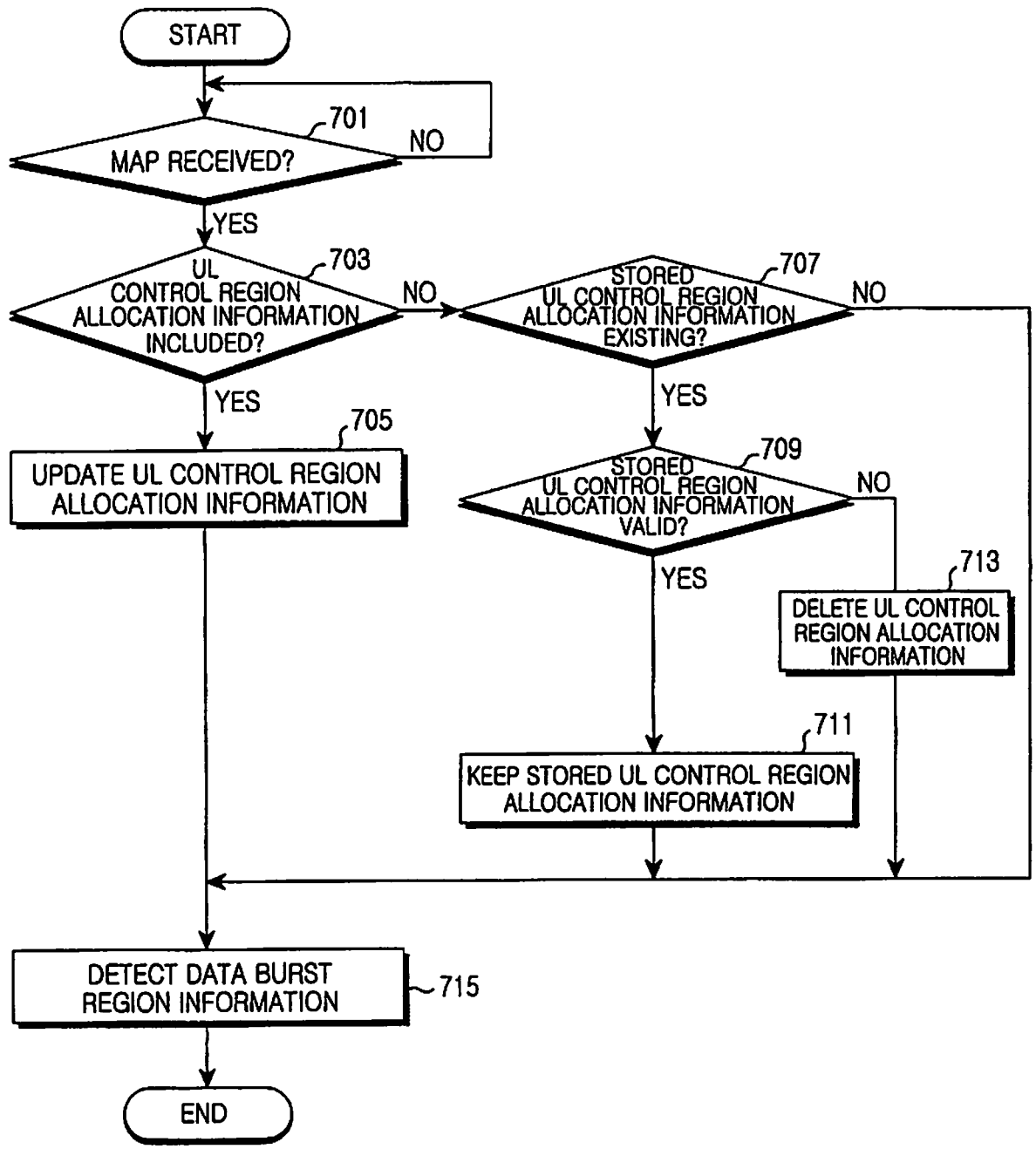
FIG. 7 is a flowchart illustrating an operation in the MS for detecting a resource allocation information message in the broadband wireless communication system according to another exemplary embodiment of the present invention.

FIG. 7 is a flowchart illustrating an operation in the MS for detecting a resource allocation information message in the OFDMA communication system according to another exemplary embodiment of the present invention.

Referring to FIG. 7, the MAP interpreter 313 monitors reception of a MAP message in step 701.

Upon receipt of the MAP message, the MAP interpreter 313 determines whether the MAP message includes UL control region allocation information in step 703. UL control regions include a ranging channel, a CQI channel, an ACK channel, and a sounding channel, and the CQI channel is equivalent to a fast feedback channel.

In the presence of the UL control region allocation information, the MAP interpreter 313 updates stored UL control region allocation information to the received UL control region allocation information in step 705.

In the absence of the UL control region allocation information, the MAP interpreter 313 determines whether previous UL control region allocation information has been stored in step 707.

If the previous UL control region allocation information has been stored, the MAP interpreter 313 checks the valid duration of the stored UL control region allocation information in step 709.

If the UL control region allocation information is still valid, the MAP interpreter 313 keeps the stored UL control region allocation information in step 711.

On the contrary, if the UL control region allocation information is determined to be invalid in step 709, the MAP interpreter 313 deletes the stored UL control region allocation information in step 713. Since the UL control region allocation information whose valid duration has elapsed is not reliable, use of an area indicated by the UL control region allocation information is prevented by deleting the UL control region allocation information. Besides the deletion, a flag can be set in the MS to indicate whether the UL control region allocation information is valid, or the MS may always check the valid duration of the UL control region allocation information.

The MAP interpreter 313 detects data burst region information in step 715.

In the above-described embodiments of the present invention, UL control region allocation information is periodically generated and included in a MAP message. Here, the UL control region allocation information may describe resource allocation to the entire UL control regions or a specific control region such as a ranging region.

A third embodiment of the present invention is proposed in which the BS sets a valid duration indicator for each UL control region in generating MAP information. For instance, a Connection IDentifier (CID) included in a UL-MAP Information Element (UL-MAP_IE) can be used as a valid duration indicator for allocation information included in the UL-MAP_IE. For a UL-MAP_IE that provides initial ranging region information, the BS setting '0000' in a CID included in the UL-MAP_IE may indicate that the initial ranging region information is valid until new initial ranging region information is transmitted. The BS setting the CID to 'ffff' may indicate that the initial ranging region information is valid only in a frame carrying the UL-MAP_IE, i.e., the CID of a UL-MAP_IE can be used to indicate a valid duration used in the second embodiment of the present invention, i.e., if the CID is '0000', the valid duration lasts until a frame carrying new initial ranging region information is received. If the CID is 'ffff', the valid duration is confined to one frame.

A fourth embodiment of the present invention can be contemplated, in which UL control region allocation information is transmitted in a broadcast message. The broadcast message is broadcasted not in every frames. For example, an Uplink Channel Descriptor (UCD) message with an additional Type-Length-Value (TLV) illustrated in Table 1 below can be used.

TABLE 1

| Name | Type (1byte) | Length | Value |
|---|---|---|---|
| Ranging Region | 212 | 5/10/15/20 | The value of TLV consists of up to 4 concatenated sections (one section per ranging method), each having the following structure:<br>Bit #0-31: Contains same fields as in the section for UIUC = 12 in Table 287<br>Bit #32-34: Parameter d that defines periodicity in $2^d$ frames<br>Bit #35-39: Allocation phase expressed in frames |
| Fast Feedback Region | 210 | 5 | Bit #0-31: Contains same fields as in the FAST FEEDBACK Allocation IE in Table 295a<br>Bit #32-34: Parameter d that defines periodicity in $2^d$ frames<br>Bit #35-39: Allocation phase expressed in frames |
| HARQ ACK Region | 211 | 4 | Bit #0-23: Contains same fields as in HARQ ACKCH region allocation IE in Table 302t<br>Bit #24-26: Parameter d that defines periodicity in $2^d$ frames<br>Bit #27-31: Allocation phase expressed in frames |
| Sounding Region | 213 | 5 | For 5 bytes per each sounding region<br>Bit #0-31: Contains the following fields as in the PAPR reduction/Safety zone/Sounding Zone allocation IE in Table 289 |

TABLE 1-continued

| Name | Type (1byte) | Length | Value |
|---|---|---|---|
| | | | Bit #32-34: Parameter d that defines periodicity in 2^d frames<br>Bit #35-39: Allocation phase expressed in frames |

The broadcast message may include allocation information about at least one UL control region among pieces of information listed in Table 1, i.e., the broadcast message may include allocation information about a ranging region (an initial ranging region, a handover ranging region, a periodic ranging region, a bandwidth ranging region, etc.), a fast feedback region in which a CQI is fed back, an HARQ ACK region in which an HARQ response signal is fed back, and a sounding region carrying a sounding signal. Allocation information about each UL control region may include an Allocation Information Element (IE), a Periodicity indicating a period for a UL control region, and an Allocation Phase indicating the start point of the periodicity. The Periodicity is a parameter 'd' that defines periodicity in 2^d frames and the Allocation Phase is expressed in frames in Table 1.

Figure 8:
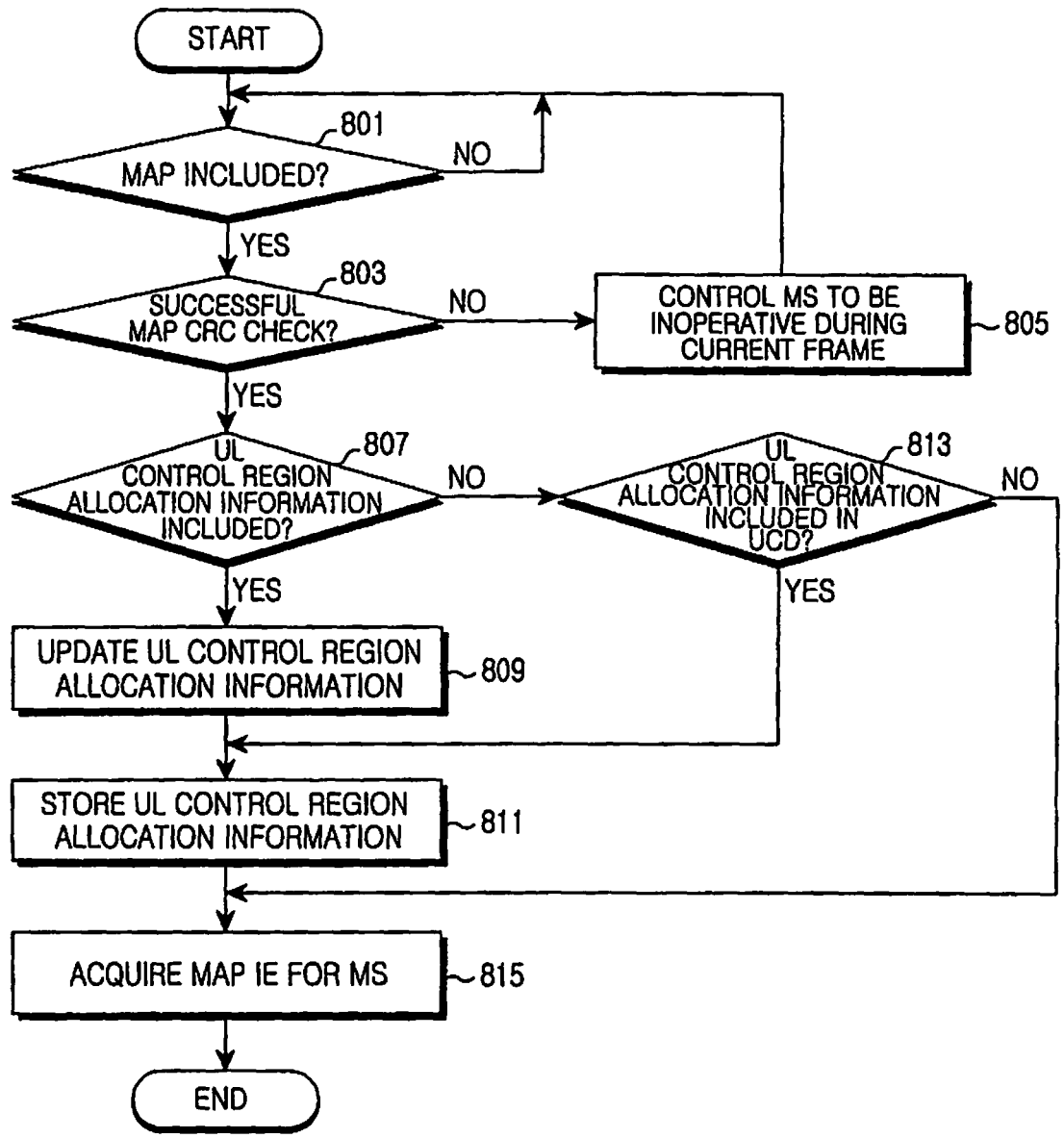
FIG. 8 is a flowchart illustrating an operation in the MS for detecting a resource allocation information message in the broadband wireless communication system according to a third exemplary embodiment of the present invention.

FIG. 8 is a flowchart illustrating an operation in the MS for detecting a resource allocation information message in the broadband wireless communication system according to a third exemplary embodiment of the present invention.

Referring to FIG. 8, the MAP interpreter 313 determines whether a received frame has a MAP message in step 801.

In the presence of the MAP message, the MAP interpreter 313 determines whether the MAP reception is normal by a Cyclic Redundancy Check (CRC) check on the MAP message in step 803.

If the MAP message is not normal, the MAP interpreter 313 controls the MS to be inoperative during the frame in step 805.

If the MAP message is normal, the MAP interpreter 313 determines whether UL control region allocation information exists in the MAP message in step 807.

In the presence of the UL control region allocation information, the MAP interpreter 313 updates current UL control region allocation information with the received UL control region allocation information in step 809 and stores the updated UL control region allocation information in step 811, i.e., the MAP interpreter 313 updates the stored previous UL control region allocation information to the new UL control region allocation information.

In the absence of the UL control region allocation information in step 807, the MAP interpreter 313 determines whether a UCD includes UL control region allocation information in step 813.

In the presence of the UL control region allocation information in the UCD, the MAP interpreter 313 stores the UL control region allocation information in step 811, i.e., the MAP interpreter 313 updates the existing UL control region allocation information to the new UL control region allocation information.

After storing the UL control region allocation information, the MAP interpreter 313 acquires a MAP IE for the MS in step 815.

As is apparent from the above description, the present invention advantageously increases the data rate of user data by reducing the volume of resource allocation information messages by periodically transmitting a resource allocation information message associated with a specific region among resource allocation information messages directed from a BS to an MS in a broadband wireless communication system.

While the present invention has been shown and described with reference to certain embodiments thereof, it will be understood by those skilled in the art that various changes in form and details may be made therein without departing from the spirit and scope of the present invention as defined by the appended claims and any equivalents thereof.

What is claimed is:

1. A method performed by a base station in a wireless communication system, the method comprising:
broadcasting a first message including first information indicating a first periodicity and a first offset of an uplink control channel for a first initial network entry;
receiving an uplink signal for the first initial network entry through the uplink control channel that is identified based on the first periodicity and the first offset;
transmitting a second message including second information indicating a second periodicity and a second offset of the uplink control channel for a second initial network entry, the second periodicity being different from the first periodicity and the second offset being different from the first offset; and
receiving an uplink signal for the second initial network entry through the uplink control channel that is identified based on the second periodicity and the second offset,
wherein a periodicity is a frame interval between 2 consecutive frames including an uplink control channel,
wherein an offset is a start point of the periodicity, and
wherein the periodicity and the offset are defined by number of frames.

2. The method of claim 1, wherein the first message or the second message further includes information regarding another uplink control channel for a hybrid automatic repeat request (HARQ) acknowledge (ACK), a sounding reference signal (SRS) or channel quality information (CQI) feedback.

3. The method of claim 1, wherein the periodicity is represented by a parameter d, and
wherein the periodicity is determined as $2d$ frames.

4. The method of claim 1, wherein a frame is composed of sub-frames, and the first message or the second message includes information indicating a sub-frame position of an uplink control channel within a frame.

5. The method of claim 1, wherein the first information or the second information indicates that a periodicity is one (1) frame or two (2) frames.

6. The method of claim 1, wherein the first information or the second information further indicates a position of the uplink control channel in each of frames identified based on the first information or the second information.

7. A method performed by a mobile station (MS) in a wireless communication system, the method comprising:
receiving a first message, broadcasted by the base station, including first information indicating a first periodicity and a first offset of an uplink control channel for a first initial network entry;
transmitting an uplink signal for the first initial network entry through the uplink control channel that is identified based on the first periodicity and the first offset;
receiving a second message including second information indicating a second periodicity and a second offset of the uplink control channel for a second initial network entry, the second periodicity being different from the first periodicity and the second offset being different from the first offset; and transmitting an uplink signal for the second initial network entry through the uplink control channel that is identified based on the second periodicity and the second offset, wherein a periodicity is a frame interval between 2 consecutive frames including an uplink control channel, wherein an offset is a start point of the periodicity, and wherein the periodicity and the offset are defined by number of frames.

8. The method of claim 7, wherein receiving the first message comprises receiving the message broadcasted to a plurality of MSs including the MS.

9. The method of claim 7, wherein the first message or the second message further includes information regarding another uplink control channel for a hybrid automatic repeat request (HARQ) acknowledge (ACK), a sounding reference signal (SRS) or channel quality information (CQI) feedback.

10. The method of claim 7, wherein the periodicity is represented by a parameter d, and wherein the periodicity is determined as $2d$ frames.

11. The method of claim 7, wherein a frame is composed of sub-frames, and the first message or the second message includes information indicating a sub-frame position of an uplink control channel within a frame.

12. The method of claim 7, wherein the first information or the second information indicates that a periodicity is one (1) frame or two (2) frames.

13. The method of claim 7, wherein the first information or the second information further indicates a position of the uplink control channel in each of frames identified based on the first information or the second information.

14. A mobile station (MS) in a wireless communication system, the MS comprising:

a transceiver; and at least one processor coupled to the transceiver and configured to:

receive a first message, broadcasted by the base station, including first information indicating a first periodicity and a first offset of an uplink control channel for a first initial network entry;

transmit an uplink signal for the first initial network entry through the uplink control channel that is identified based on the first periodicity and the first offset;

receive a second message including second information indicating a second periodicity and a second offset of the uplink control channel for a second initial network entry, the second periodicity being different from the first periodicity and the second offset being different from the first offset; and transmit an uplink signal for the second initial network entry through the uplink control channel that is identified based on the second periodicity and the second offset, wherein a periodicity is a frame interval between 2 consecutive frames including an uplink control channel, wherein an offset is a start point of the periodicity, wherein the periodicity and the offset are defined by number of frames.

15. The MS of claim 14, wherein receiving the first message comprises receiving the message broadcasted to a plurality of MSs including the MS.

16. The MS of claim 14, wherein the first message or the second message further includes information regarding another uplink control channel for a hybrid automatic repeat request (HARQ) acknowledge (ACK), a sounding reference signal (SRS) or channel quality information (CQI) feedback.

17. The MS of claim 14, wherein the periodicity is represented by a parameter d, and wherein the periodicity is determined as $2d$ frames.

18. The MS of claim 14, wherein a frame is composed of sub-frames, and the first message or the second message includes information indicating a sub-frame position of an uplink control channel within a frame.

19. The MS of claim 14, wherein the first information or the second information indicates that a periodicity is one (1) frame or two (2) frames.

20. The MS of claim 14, wherein the first information or the second information further indicates a position of the uplink control channel in each of frames identified based on the first information or the second information.

* * * * *